(12) United States Patent
Takei et al.

(10) Patent No.: US 6,759,301 B2
(45) Date of Patent: Jul. 6, 2004

(54) SEMICONDUCTOR DEVICE AND METHOD FOR MANUFACTURING THE SAME

(75) Inventors: Manabu Takei, Nagano (JP); Tatsuhiko Fujihira, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/461,094

(22) Filed: Jun. 13, 2003

(65) Prior Publication Data

US 2003/0211694 A1 Nov. 13, 2003

Related U.S. Application Data

(62) Division of application No. 09/722,927, filed on Nov. 27, 2000, now Pat. No. 6,610,572.

(30) Foreign Application Priority Data

Nov. 26, 1999 (JP) ............................................ 11-336130
Dec. 1, 1999 (JP) ............................................ 11-342382

(51) Int. Cl.[7] ............................................ H01L 21/336
(52) U.S. Cl. ........................ 438/268; 438/138; 438/270
(58) Field of Search ........................ 438/268, 270–274, 438/138, 528, 269

(56) References Cited

U.S. PATENT DOCUMENTS

| | | | | |
|---|---|---|---|---|
| 5,023,696 A | * | 6/1991 | Ogino | 257/612 |
| 5,541,122 A | * | 7/1996 | Tu et al. | 438/138 |
| 5,589,408 A | * | 12/1996 | Robb et al. | 438/273 |
| 5,729,031 A | | 3/1998 | Uenishi | 257/139 |
| 5,751,023 A | | 5/1998 | Aono | 257/138 |
| 5,841,197 A | | 11/1998 | Adamic, Jr. | 257/777 |
| 6,072,199 A | | 6/2000 | Iwamuro | 257/139 |
| 6,274,892 B1 | * | 8/2001 | Kub et al. | 257/131 |

FOREIGN PATENT DOCUMENTS

| | | |
|---|---|---|
| JP | 64-19771 A | 1/1989 |
| JP | 3-96281 A | 4/1991 |
| JP | 5-82791 A | 4/1993 |
| JP | 9-232326 A | 9/1997 |

* cited by examiner

Primary Examiner—Michael Trinh
(74) Attorney, Agent, or Firm—Rossi & Associates (57) ABSTRACT

A semiconductor device is provided which can be manufactured even by using an inexpensive FZ wafer in a wafer process and still has a sharp inclination of a high impurity concentration in a high impurity concentration layer at the outermost portion of the reverse side and at the boundary between the high impurity concentration and a low impurity concentration drift layer, thus achieving both low cost and a high performance. A method for manufacturing a semiconductor device is also provided which can form a high impurity concentration buffer layer and a high impurity concentration layer at the outermost portion of the reverse side without any significant trouble, even after the formation of an active region and an electrode thereof at the right side, to thereby achieve both low cost and high performance.

9 Claims, 5 Drawing Sheets

SEMICONDUCTOR DEVICE AND METHOD FOR MANUFACTURING THE SAME

This application is a divisional of U.S. Ser. No. 09/722,927 filed on Nov. 27, 2000 now U.S. Pat. No. 6,610,572.

BACKGROUND OF THE INVENTION

1. Field of the Invention

The present invention relates generally to a power semiconductor device such as a diode, a MOSFET (field-effect insulated gate transistor) and an IGBT (a conductivity modulation-type transistor) for use in a power converter or the like and, more particularly, to a semiconductor device and a method for manufacturing the same that are suitable for the use of a FZ (floating zone) wafer.

2. Description of Related Art

Figure 6:
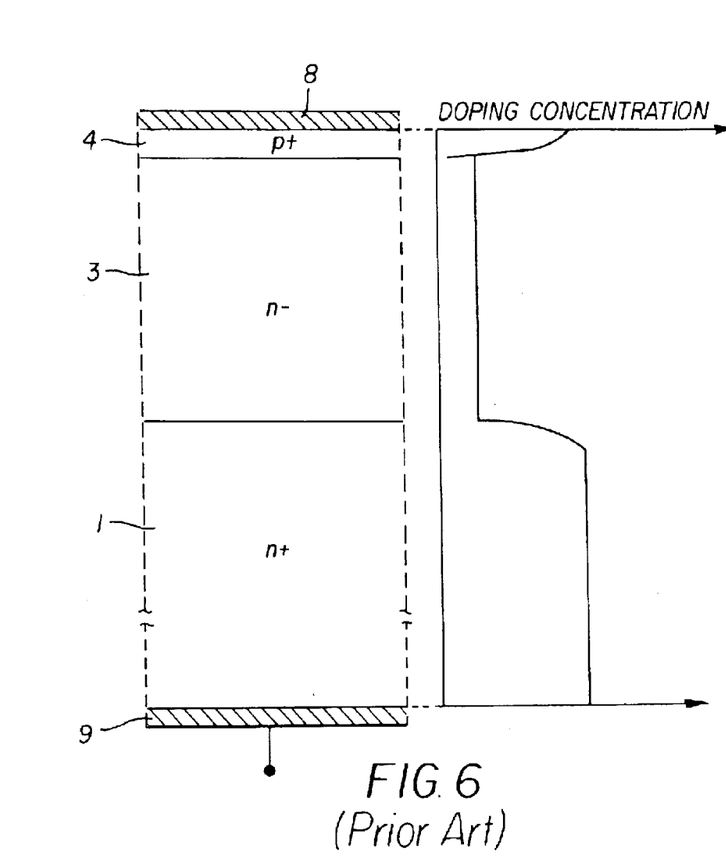
FIG. 6 is a cross-sectional view showing a part of the structure of a conventional epitaxial diode.

An epitaxial diode in FIG. 6 is manufactured by using an epitaxial wafer that is formed by growing a low-concentration n-type epitaxial layer, which functions as an $n^-$ drift layer 3, on a high-concentration n-type silicon substrate forming an $n^+$ cathode layer 1. The $n^-$ drift layer 3 carries drift current in an ON state. In a blocking mode (an OFF state), a depletion layer spreads into the $n^+$ cathode layer 1 from a pn junction between the $n^-$ drift layer 3 and a $p^+$ anode layer 4 to thereby assure a withstand voltage. The $n^+$ cathode layer 1 has a function of preventing the depletion layer from reaching a cathode electrode 9 in the blocking mode and achieving a favorable ohmic contact with the cathode electrode 9. The epitaxial diode using the epitaxial wafer has the high-concentration n-type silicon substrate and the $n^-$ drift layer 3, which is grown on the high-concentration n-type silicon substrate by an epitaxial method. Therefore, an impurity concentration inclines sharply in the $n^+$ cathode layer 1 and at the boundary between the $n^+$ cathode layer 1 and the $n^-$ drift layer 3, as shown in the graph representing the longitudinal dependency of a doping concentration in FIG. 6. Thus, there is a favorable tradeoff relationship between a forward voltage and the withstand voltage. The epitaxial wafer, however, is expensive and, therefore, it is costly to manufacture the epitaxial diode.

Figure 7:
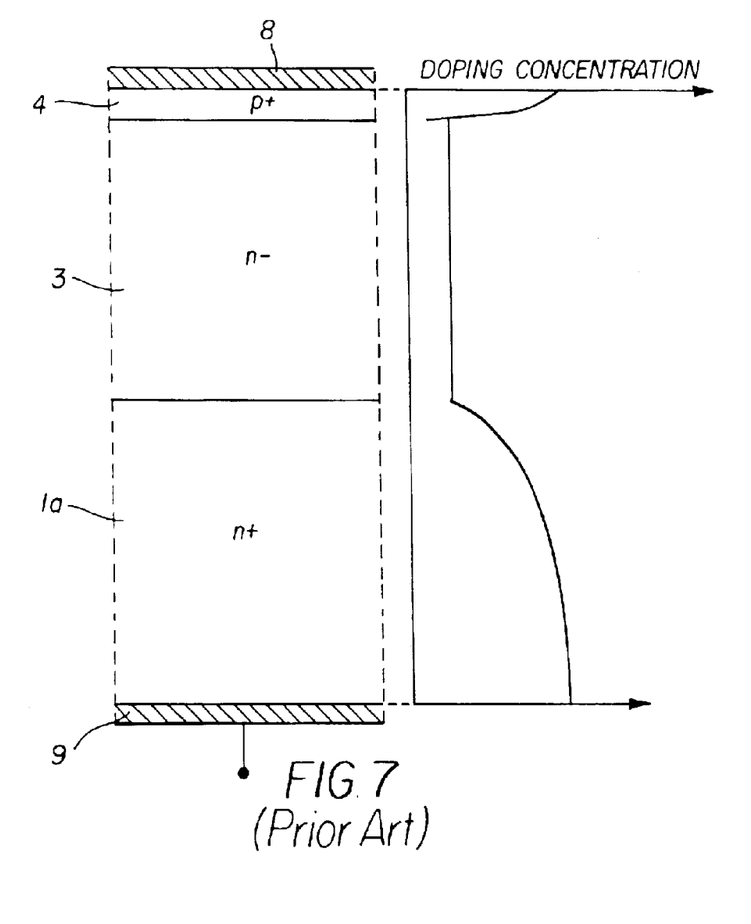
FIG. 7 is a cross-sectional view showing a part of the structure of a conventional DW diode.

On the other hand, a DW diode in FIG. 7 is manufactured from a DW wafer that is fabricated by diffusing a high-concentration phosphorus from the reverse side of a low-concentration n-type silicon substrate (FZ wafer), which functions as the $n^-$ drift layer 3, to form an $n^+$ cathode layer 1a. The DW wafer is less expensive than the epitaxial wafer because the DW wafer does not require a growing step by an epitaxial method. Thus, the use of the DW wafer can reduce the cost of manufacturing the DW diode. As shown in the graph representing the longitudinal dependency of doping concentration in FIG. 7, however, the impurity concentration inclines gently in the $n^+$ cathode layer 1a and at the boundary between the $n^+$ cathode layer and the $n^-$ drift layer 3. Therefore, there is an unfavorable tradeoff relationship between the forward voltage and the withstand voltage.

Figure 8:
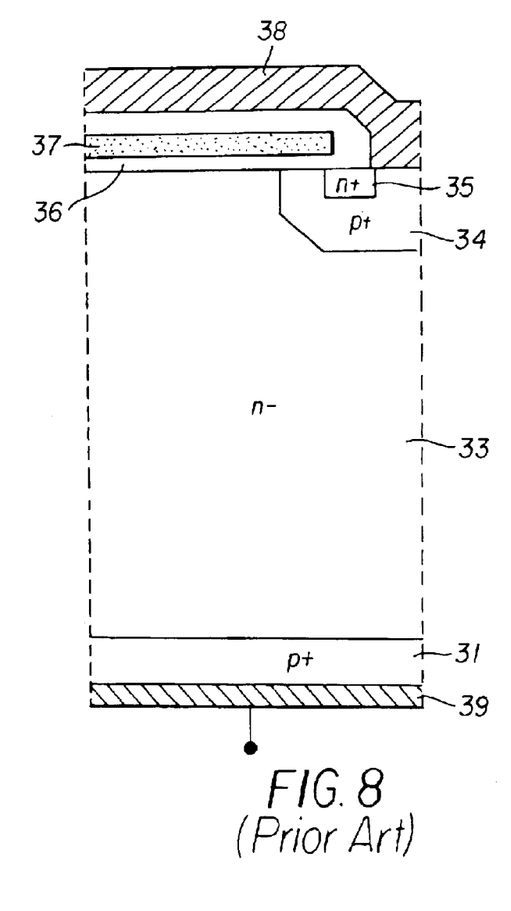
FIG. 8 is a cross-sectional view showing a part of the structure of a conventional non-punch through IGBT.

A non-punch through IGBT in FIG. 8 is manufactured by using an inexpensive FZ wafer forming an $n^-$ drift layer 33. An element active region (e.g., a $p^+$ base region 34, an $n^+$ emitter region 35, a gate oxide film 36 or a gate electrode 37) and an emitter electrode 38 are formed at the right side of the FZ wafer. The reverse side of the wafer is treated to reduce it to a predetermined thickness and, then, the reverse side of the wafer is implanted with boron ions, a portion of the implanted ions being activated by annealing at a low temperature of not greater than 400° C. This forms a $p^+$ collector layer 31. To acquire a sufficient withstand voltage in a forward blocking mode, the $n^-$ drift layer 33 must have enough thickness to prevent the depletion layer spreading from the pn junction between the $p^+$ base region 34 and the $n^-$ drift layer 33 from reaching the $p^+$ collector layer 31. If the $n^-$ drift layer 33 is thick, however, the resistance is increased to significantly lower the voltage in the ON state of the IGBT. This makes it difficult to achieve a large volume of power and increases the number of carriers accumulated in the $n^-$ drift layer 33. In addition, there is a great turnoff loss. Although the non-punch through IGBT can be manufactured at a low cost, it cannot achieve high performance.

Figure 9:
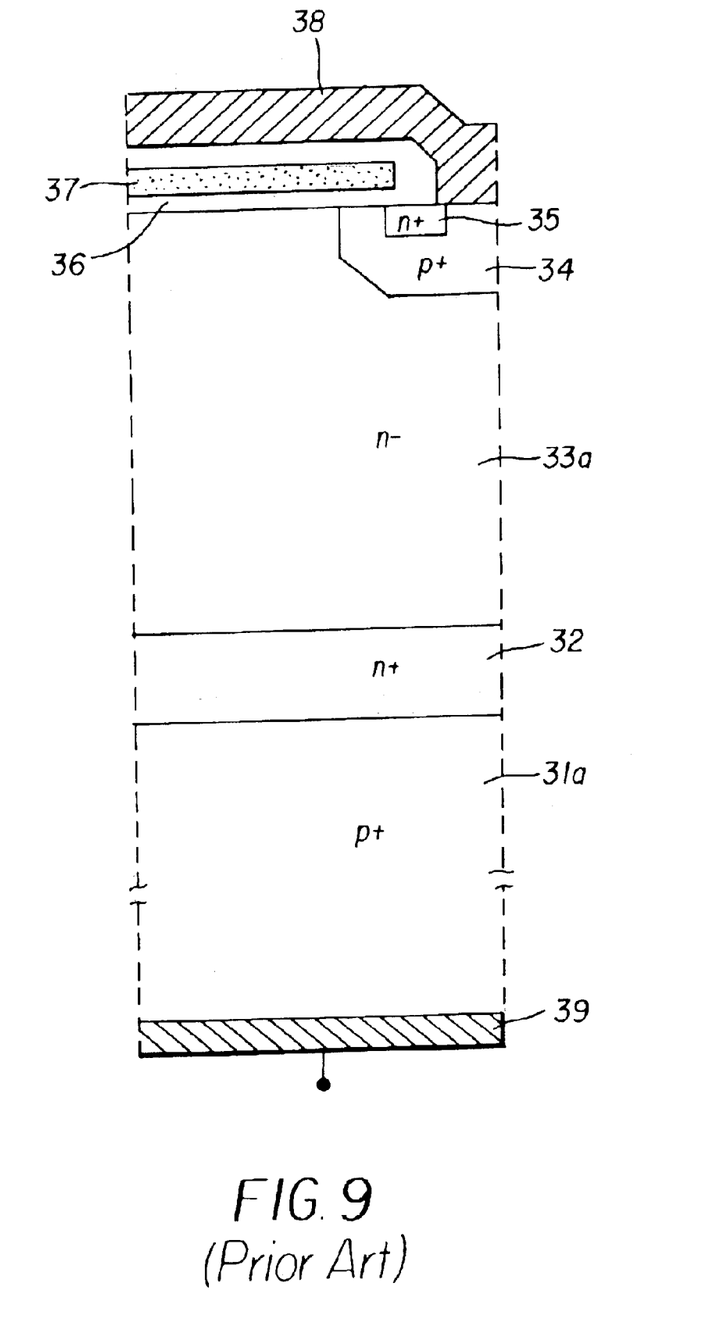
FIG. 9 is a cross-sectional view showing a part of the structure of a conventional punch through IGBT.

On the other hand, a punch through IGBT in accordance with FIG. 9 is manufactured by using an epitaxial wafer, which is fabricated by growing a high-concentration n-type epitaxial layer functioning as an $n^+$ buffer 32 on a high-concentration p type substrate forming a $p^+$ collector layer 31a, and growing a low-concentration n-type epitaxial layer functioning as an $n^-$ drift layer 33a on the high-concentration n-type epitaxial layer. In a forward blocking mode, a depletion layer spreads slowly in the high impurity concentration $n^+$ buffer layer 32, and it is therefore possible to acquire a high withstand voltage even in the thin $n^-$ drift layer 33a. Therefore, the voltage of the punch through IGBT is lowered by a smaller degree in the ON state, as compared with the non-punch through IGBT with the same withstand voltage. In addition, the punch through IGBT increases the current capacity and reduces the turnoff loss. However, it costs more to manufacture the punch through IGBT, since there is the need to use an epitaxial wafer.

A power semiconductor device, such as a diode or a MOSFET, has recently achieved high characteristics, but it is still desired to further reduce costs. To reduce the costs, it is advantageous to adopt an inexpensive FZ wafer in a wafer process. In order to achieve high characteristics, the reverse side of the FZ wafer, which has a surface active region, such as the $p^+$ anode layer 4 and the anode electrode 8 thereof, is treated to reduce it to a predetermined thickness; phosphorus and arsenic ions are implanted from the reverse side; and an annealing process is performed to thereby activate the impurities and form an $n^+$ cathode layer. Since the maximum concentration point can be set at a deep portion by the ion implantation method, the impurity concentration inclines sharply in the $n^+$ cathode layer and at the boundary between the $n^+$ cathode layer and the $n^-$ drift layer. Therefore, the power semiconductor device can be expected to achieve high characteristics of the same level as achieved by an epitaxial diode.

The annealing temperature should be not less than about 1000° C. to activate the phosphorus or arsenic atoms sufficiently in the silicon wafer. Thus, the annealing must be completed before the aluminum anode electrode 8, which has a low fusing point (about 700° C.), is adhered to the surface of the wafer. Even if the annealing is performed before the adhesion of the anode electrode 8, the wafer bows greatly when the thin wafer (after it has been treated to reduce its thickness) is annealed at high temperatures of 1000° C. or more. It is therefore impossible to perform a photolithography process to form the anode electrode 8 at a subsequent stage. For this reason, the inexpensive FZ wafer cannot be used in the wafer process. This problem applies not only to the above-mentioned longitudinal diode cathode layer, but also to the formation of a general ohmic contact layer (high impurity concentration layer) at the outermost surface of the reverse side, such as a drain layer of a longitudinal MOSFET or a collector layer of an IGBT (conductivity modulation-type MOSFET) of a non-punch through IGBT.

Accordingly, it is an object of the present invention to provide a semiconductor device, which can be manufactured with less trouble by using the inexpensive FZ wafer in the wafer process and has a sharp impurity concentration in a high impurity concentration layer at the outermost portion of the reverse side and at the boundary between the high impurity concentration layer and a low impurity concentration drift layer, thereby achieving both low cost and high performance.

In recent years, power semiconductor devices such as IGBT devices achieve high characteristics, but it is also desired to reduce costs further. To reduce cost, it is advantageous to adopt an inexpensive FZ wafer in a wafer process. To achieve high characteristics, an $n^+$ buffer layer 32 must be formed. For example, the reverse side of the FZ wafer, which has a surface active region, such as a $p^+$ anode layer 4 and the anode electrode 8 thereof, is treated to reduce it to a predetermined thickness; Ions, such as phosphorus or arsenic ions, are implanted from the reverse side; and an annealing process is performed to activate the implanted impurities to form an $n^+$ cathode layer.

The annealing temperature, however, must be 1000° C. or more to activate the phosphorus or arsenic atoms sufficiently in the silicon wafer. Thus, the annealing must be completed before the aluminum emitter electrode 38 with a low fusing point (about 700° C.) becomes adhered to the surface of the wafer. Even if the annealing is performed prior to the adhesion of the emitter electrode 38, the wafer bows greatly when the thin wafer (after it has been treated to reduce its thickness) is annealed at a high temperature of 1000° C. or more. It is therefore impossible to perform a photolithography process to form the emitter electrode 38 at a subsequent stage. For this reason, it has been impossible to use the inexpensive FZ wafer in the conventional wafer process. Accordingly, the $p^+$ collector layer 31 must be formed by annealing at a low temperature in the case of the non-punch through IGBT in FIG. 8.

Accordingly, it is an object of the present invention to provide a semiconductor device that can be manufactured with less trouble by using an inexpensive FZ wafer in the wafer process and that can form a high impurity concentration buffer layer and reverse conducting high impurity concentration layer at the outermost portion of the reverse side without any significant trouble, even after the formation of the element active region and the electrode thereof on the right side of the wafer, thereby achieving both low cost and high performance.

SUMMARY OF THE INVENTION

The above object can be accomplished by forming a high impurity concentration layer at the outermost portion of the reverse side (the second principal side) by a low-temperature process.

According to the first arrangement, a semiconductor device, which uses a first-conductivity-type low impurity concentration substrate forming a first-conductivity-type low impurity concentration drift layer, and which comprises an element active region and a first electrode thereof formed at a first principal side of the substrate, and a high impurity concentration layer and a second electrode thereof formed at an outermost portion of a second principal side of the substrate, is characterized in that: the high impurity concentration layer is composed of an n-type defect layer.

A method for manufacturing the semiconductor device, which uses the n-type defect layer at the outermost portion of the second principal side as the high concentration n-type semiconductor layer, such as a contact layer, comprises the steps of: forming the element active region and the first electrode on the first principal side of the substrate; treating the second principal side of the substrate to reduce it to a predetermined thickness; irradiating protons from the second principal side; and performing an annealing process to thereby form the n-type defect layer. An annealing temperature (not greater than about 700° C.) for activating the n-type defect layer may be lower than a fusing point of a first electrode layer made of aluminum or the like. It is therefore possible to form the n-type defect layer at the second principal side, even after the adhesion of the first electrode at the first principal side, without any significant trouble. This semiconductor device can be manufactured at low cost, since it is possible to use an inexpensive n-type low impurity concentration FZ wafer. Due to the use of a proton ion implantation method, the range can be long and the maximum concentration point can be set in a deep portion. Thus, the impurity concentration inclines sharply in the n-type defect layer as the high impurity concentration layer and at the boundary between the n defect layer and the low impurity concentration drift layer. This achieves a high characteristic of the same level as a semiconductor device that is manufactured by using an epitaxial wafer.

The annealing process is preferably performed at a temperature of not less than about 300° C. and not greater than about 500° C. The irradiation energy used in the irradiation of protons may be not greater than about 1 MeV.

According to the second arrangement, a semiconductor device, which uses a first-conductivity-type low impurity concentration substrate forming a first-conductivity-type low impurity concentration drift layer, and which comprises an element active region and a first electrode thereof formed at a first principal side of the substrate, and a high impurity concentration layer and a second electrode thereof formed at an outermost portion of a second principal side of the substrate, is characterized in that the first-conductivity-type high impurity concentration layer is an oxygen donor dope layer. If the high impurity concentration layer is the oxygen donor dope layer, the annealing process can be performed at a lower temperature than the fusing point of the first electrode, which is made of aluminum or the like. This enables the formation of the high impurity concentration layer at the second principal side, even after the adhesion of the first electrode layer, without any significant trouble.

A method for manufacturing this semiconductor device comprises the steps of: forming the element active region and the first electrode at the first principal side of the substrate; treating the second principal side of the substrate to reduce it to a predetermined thickness; implanting oxygen ions into the second principal side; and performing an annealing process to thereby form an oxygen donor dope layer. This semiconductor device can be manufactured at low cost, since it is possible to use an inexpensive n-type low impurity concentration FZ wafer. Due to the use of the oxygen ion implantation method, the range can be long and the maximum concentration point can be set in a deep portion. Thus, the impurity concentration inclines sharply in the oxygen donor dope layer as the high impurity concentration layer and at the boundary between the oxygen donor dope layer and the n-type low impurity concentration drift layer. This achieves a high characteristic of the same level as a semiconductor device that is manufactured by using an epitaxial wafer. The annealing process is preferably performed at a temperature of not less than about 300° C. and not greater than about 500° C.

According to the third arrangement, a method for manufacturing a semiconductor device, which uses a first-conductivity-type low impurity concentration substrate forming a first-conductivity-type low impurity concentration drift layer, and which comprises an element active region and a first electrode thereof formed at a first principal side of the substrate, and a high impurity concentration layer formed at an outermost portion of a second principal side of the substrate and a second electrode thereof, comprises the steps of: forming the element active region and the first electrode on the first principal side of the substrate; treating the second principal side of the substrate to reduce it to a predetermined thickness; implanting impurity ions from the second principal side; and irradiating the second principal side with light or laser while cooling the first principal side, thereby forming the high impurity concentration layer.

As the annealing process for forming the high impurity concentration layer at the second principal side, a lamp annealing or a laser annealing is performed with respect to the second principal side, while the first principal side having the first electrode is cooled (by jetting coolant gas, by using a heat sink, or the like). Therefore, an annealing temperature at the second principal side can be set at a higher temperature than the fusing point of aluminum (700° C. or more), while a temperature gradient is ensured along the thickness of the substrate. Moreover, even the implanted impurities with a short range can be activated sufficiently and, thus, phosphorus or arsenic can be used as donor impurities. This semiconductor device can be manufactured at low cost, since it is possible to use an inexpensive n-type low impurity concentration FZ wafer. Due to the use of the proton ion implantation method, the range can be long and the maximum concentration point can be set in a deep portion. Thus, the impurity concentration inclines sharply in the high impurity concentration layer and at the boundary between the high impurity concentration layer and the drift layer. This achieves a high characteristic of the same level as a semiconductor device that is manufactured by using an epitaxial wafer.

The implantation energy in the implantation of phosphorus or arsenic ions may be not greater than about 1 MeV. The dose amount of the phosphorus or arsenic is preferably not less than about $1 \times 10^{13}$ cm$^{-2}$ and not greater than about $1 \times 10^{16}$ cm$^{-2}$.

The present invention may be applied, not only to diodes and MOSFETs, but also to general longitudinal semiconductor devices having an n$^-$ drift layer and an n-type high impurity concentration layer (e.g., an ohmic contact layer) at the outermost portion of the second principal side. A third arrangement of the present invention is not restricted to the implantation of donor impurities. It is also possible to implant acceptor impurities (e.g., boron). Thus, the third arrangement of the present invention may be applied to general semiconductor devices having an n$^-$ drift layer and an n-type high impurity concentration layer (e.g., an ohmic contact layer) at the outermost portion of the second principal side. The third arrangement may be applied to an ohmic contact layer (a high impurity concentration layer of any conductivity type) at the outermost portion of the reverse side, as is the case with a collector layer of a non-punch through IGBT (a conductivity modulation-type MOSFET).

The above object can also be accomplished by forming a high impurity concentration buffer layer at the reverse side (the second principal side) and a reverse-conductivity-type high impurity concentration layer at the outermost portion of the reverse side by a low-temperature process.

According to a fourth arrangement of the present invention, a method for manufacturing a semiconductor device, which uses a first-conductivity-type low impurity concentration substrate to form a first-conductivity-type low impurity concentration drift layer, and which comprises an element active region and a first electrode thereof formed at a first principal side of the substrate, a second-conductivity-type high impurity concentration layer and a second electrode thereof formed at an outermost portion of a second principal side of the substrate, and a first-conductivity-type impurity concentration buffer layer formed between the drift layer and the second-conductivity-type high impurity concentration layer, comprises the steps of: forming the element active region and the first electrode at the first principal side of the substrate; treating the second principal side of the substrate to reduce it to a predetermined thickness; irradiating protons from the second principal side; performing an annealing process to thereby form the buffer layer; implanting acceptor impurity ions from the second principal side; and performing an annealing process to thereby form the second-conductivity-type high impurity concentration layer.

The irradiation of protons and the low-temperature annealing process form an n-type defect layer as a lattice defect layer. The n-type defect layer functions substantially as an n-type high impurity concentration buffer layer. Since the range of the protons is long, the n-type defect layer is formed in a deeper portion than the second principal side. The annealing temperature for activating the n-type defect layer may be lower than the fusing point of the first electrode, made from a material such as aluminum, and thus, the n-type defect layer as the n-type high impurity concentration buffer layer can be formed even after the adhesion of the first electrode without any significant trouble.

In the annealing process for forming the second-conductivity-type high impurity concentration at the second principal side, energy (light or laser) is irradiated toward the second principal side for a short period of time while the first principal side having the first electrode is cooled (e.g., by jetting coolant gas or by using a heat sink). This ensures a temperature gradient across the thickness of the substrate, and the temperature at the first principal side can be set at a lower temperature (e.g., not greater than about 450° C.) than the fusing point of the aluminum or like electrode metal, and the annealing temperature at the second principal side can be set at a higher temperature (e.g., about 700° C. or more) than the fusing point of the electrode metal, usually aluminum or the like. This prevents the fusion of the first electrode and the increase in contact resistance between the first electrode and the silicon, and enables the sufficient activation of implanted impurities within a short range. Accordingly, this enables the use of an inexpensive low impurity concentration FZ wafer, and therefore achieves a significant reduction in the cost of the semiconductor device of the invention.

Additionally, it is possible produce a semiconductor device provided with an n-type high impurity concentration buffer layer, and this increases the current capacity and reduces the turnoff loss. It is, therefore, also possible to provide a less expensive semiconductor device that still exhibits high performance.

Either the buffer layer or the second-conductivity-type high impurity concentration layer may be formed first. The annealing process in the formation of the second-conductivity-type high impurity concentration layer is also used for the formation of the buffer layer. This would reduce the number of annealing steps. The irradiation energy used in the irradiation of protons may be not greater than about 1 MeV. The annealing process in the formation of the buffer layer may be performed at a temperature of about 300° C. or more, but not greater than about 500° C.

According to a fifth arrangement of the present invention, a method for manufacturing a semiconductor device which uses a first-conductivity-type low impurity concentration substrate forming a first-conductivity-type low impurity concentration drift layer, and which comprises an element active region and a first electrode thereof formed at a first principal side of the substrate, a second-conductivity-type high impurity concentration layer and a second electrode thereof formed at an outermost portion of a second principal side of the substrate, and a first-conductivity-type high impurity concentration buffer layer formed between the drift layer and the second-conductivity-type high impurity concentration layer, comprises the steps of: forming the element active region and the first electrode at the first principal side of the substrate and treating the second principal side of the substrate to reduce it to a predetermined thickness; implanting oxygen ions from the second principal side and performing an annealing process to thereby form the buffer layer; and irradiating acceptor impurity ions from the second principal side and performing an annealing process to thereby form the second-conductivity-type high impurity concentration layer.

According to a fifth arrangement of the present invention, the second-conductivity-type high impurity concentration layer is formed in the same manner as in the fourth arrangement, but the buffer layer is formed by implanting oxygen ions from the second principal side and performing a low-temperature annealing process. Due to the use of an oxygen ion implantation method, the range can be long and the maximum concentration point can be set in a deep portion to thereby form an oxygen donor dope layer as a buffer layer. In this case, an annealing temperature for forming the second-conductivity-type high impurity concentration layer can be set at a higher temperature (e.g., about 700° C. or more) than the fusing point of aluminum.

Either the buffer layer or the second-conductivity-type high impurity concentration layer may be formed first. The annealing process in the formation of the second-conductivity-type high impurity concentration layer is also used for the formation of the buffer layer. This would reduce the number of annealing steps. The irradiation energy in the irradiation of protons may be not greater than about 1 MeV. The annealing process in the formation of the buffer layer may be performed at a temperature of not less than about 300° C. and not greater than about 500° C.

According to a sixth arrangement, a method for manufacturing a semiconductor device which uses a first-conductivity-type low impurity concentration substrate forming a first-conductivity-type low impurity concentration drift layer, and which comprises an element active region and a first electrode thereof formed at a first principal side of the substrate, a second-conductivity-type high impurity concentration layer and a second electrode thereof formed at an outermost portion of a second principal side of the substrate, and a first-conductivity-type high impurity concentration buffer layer formed between the drift layer and the second-conductivity-type high impurity concentration layer, the method comprising the steps of: forming the element active region and the first electrode at the first principal side of the substrate and treating the second principal side of the substrate to reduce it to a predetermined thickness; implanting donor impurity ions into the second principal side and performing an annealing process of irradiating energy to the second principal side while cooling the first principal side to thereby form the buffer layer; and implanting acceptor impurity ions into the second principal side and performing an annealing process to thereby form the second-conductivity-type high impurity concentration layer.

According to the sixth arrangement of the present invention, the second-conductivity-type high impurity concentration layer is formed in the same manner as in the fourth arrangement, but the buffer layer is formed by implanting donor impurity ions into the second principal side and performing an annealing process of irradiating energy (e.g., light or laser) toward the second principal side while cooling the first principal side. In the annealing process, an annealing temperature at the second principal side can be set at a higher temperature than the fusing point of aluminum (e.g., about 700° C.), while a temperature gradient is ensured across the thickness of the substrate. This enables the sufficient activation of the implanted impurities with a short range. According to the sixth arrangement, in the annealing process for forming the second-conductivity-type high impurity concentration at the second principal side, energy (light or laser) is irradiated toward the second principal side for a short period of time, while the first principal side having the first electrode is cooled (e.g., by jetting coolant gas and by using a heat sink). This ensures a temperature gradient across the thickness of the substrate. As a result, the temperature at the first principal side can be set at a lower temperature than the fusing point of the aluminum or the like, and the annealing temperature at the second principal side can be set at a higher temperature than the fusing point of the aluminum or the like. This prevents the fusion of the first electrode or the like, and enables the sufficient activation of the implanted impurities with a short range. The energy may be irradiated for a short period of time.

Either the buffer layer or the second-conductivity-type high impurity concentration layer may be formed first. The annealing process in the formation of the second-conductivity-type high impurity concentration layer is also used for the formation of the buffer layer. This would reduce the number of annealing steps.

The donor impurity ions may be phosphorus or arsenic ions. The implantation energy used in the implantation of phosphorus or arsenic ions may be not greater than about 1 MeV. A dose amount of the phosphorus or arsenic may be not less than about $1\times10^{12}$ cm$^{-2}$ and not greater than about $1\times10^{15}$ cm$^{-2}$. Boron ions may be used as the acceptor impurity ions.

The present invention may be applied not only to an IGBT but also to a thyrister and a general longitudinal semiconductor device provided with the n$^-$ drift layer and the p type high impurity concentration layer at the outermost portion of the second principal side. The sixth arrangement of the present invention may be applied to a general semiconductor device provided with the p$^-$ drift layer and the n-type high impurity concentration layer at the outermost portion of the second principal side. Moreover, the present invention may be applied not only to the longitudinal semiconductor device provided with the drift layer and the buffer layer, but also to a general longitudinal semiconductor device provided with a first-conductivity-type low impurity concentration layer and a first-conductivity-type high impurity concentration layer.

According to a seventh arrangement of the present invention, a method for manufacturing a semiconductor device which uses a first-conductivity-type low impurity concentration substrate forming a first-conductivity-type low impurity concentration drift layer, and which comprises an element active region and a first electrode thereof formed at a first principal side of the substrate, and a high impurity concentration layer and a second electrode thereof formed at an outermost portion of a second principal side of the substrate, the method comprising the steps of: forming the element active region and the first electrode at the first principal side of the substrate; treating the second principal side of the substrate to reduce it to a predetermined thickness; and implanting first or second-conductivity-type impurity ions into the second principal side and performing an annealing process of irradiating energy to the second principal side while cooling the first principal side, thereby forming the high impurity concentration layer. The high impurity concentration layer may be formed not only in the outermost layer of the second principal side but also at a more internal area than the outermost layer of the second principal side. The first principal side is cooled, for example, by jetting coolant gas or by using a heat sink. To prevent the fusion of the first electrode, a temperature gradient is ensured across the thickness of the substrate. The energy may be irradiated for a short period of time.

According to this method, the temperature at the first principal side can be set at a lower temperature than the fusing point of aluminum or the like, and the annealing temperature at the second principal side can be set at a higher temperature than the fusing point of aluminum or the like, while the temperature gradient is ensured along the thickness of the substrate. This prevents the fusion of the first electrode or the like, and enables the sufficient activation of the implanted impurities with a short range. It is thus possible to use the inexpensive low impurity concentration FZ wafer and, therefore, to achieve a significant reduction in the cost of the semiconductor device of the invention.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF PREFERRED EMBODIMENTS

Figure 1:
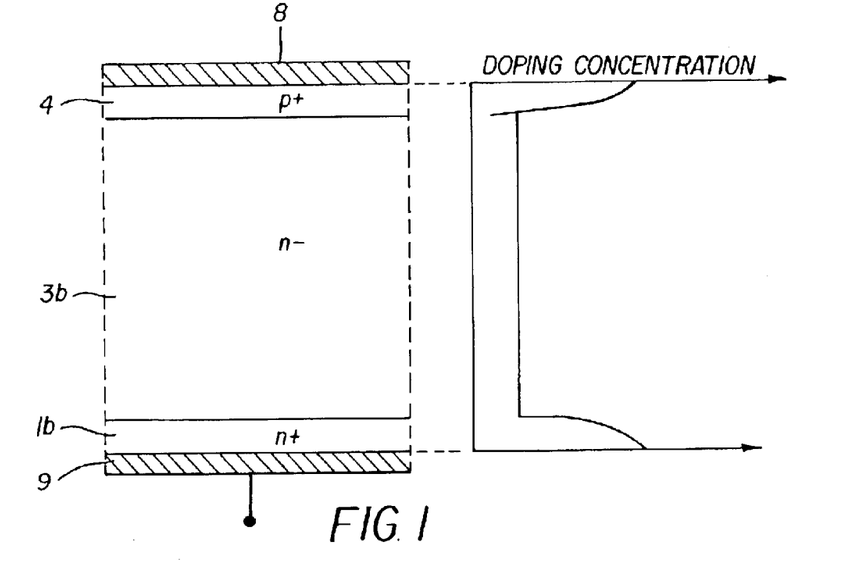
FIG. 1 is a cross-sectional view showing a part of the structure of a longitudinal diode according to a first preferred embodiment of the present invention.

Preferred embodiments of the present invention will be described hereinbelow with reference to the accompanying drawings. FIG. 1 is a cross-sectional view showing the cross-sectional structure of a longitudinal diode according to a preferred mode 1 of the present invention.

Embodiment 1

The longitudinal diode of the first preferred embodiment is a diode with a withstand voltage of 1200 V and is manufactured by using an n-type low impurity concentration FZ wafer forming an n$^-$ drift layer 3b. An element active region and an anode electrode 8 made of aluminum are formed on the right or upper side of the FZ wafer. The element active region (core part) of the diode is a pn junction between a $p^+$ anode layer 4 and the $n^-$ drift layer 3b. An $n^+$ cathode layer 1b is formed at the outermost portion of the reverse or back side of the FZ wafer, and a cathode electrode 9 made of aluminum is adhered to the $n^+$ cathode layer 1b.

The longitudinal diode, which is manufactured by using the n-type low impurity concentration FZ wafer, is fabricated in the following manner. The element active region and the anode electrode 8 are formed at the right side of the FZ wafer, and the reverse side of the FZ wafer is treated to reduce it to a predetermined thickness. This treatment may be any treatment that is sufficient to reduce the thickness sufficiently without imposing a danger of breakage of the basic structure, for example, by shaving off a portion of the reverse side, mechanical grinding or cutting, chemical etching, and methods employing combinations of these thickness-reducing techniques. Impurity ions described below are implanted into the reverse side, and a predetermined annealing process is performed to form the $n^+$ cathode layer 1b. The cathode electrode 9 is then adhered to the $n^+$ cathode layer 1b.

In the longitudinal diode of a first embodiment, the $n^+$ cathode layer 1b is composed of an n-type defect layer. The n-type defect layer is a monocrystal lattice defect layer, and functions substantially as a high concentration n-type semiconductor layer. As described above, the diode, in which the n-type defect layer at the outermost portion of the reverse side is used as the $n^+$ cathode layer 1b, is fabricated by forming the element active region (the $p^+$ anode layer 4) and the anode electrode 8 at the right side of the FZ wafer, treating the reverse side of the FZ wafer to reduce it to a predetermined thickness (e.g., by shaving), irradiating protons from the reverse side of the FZ wafer, and performing the annealing process (e.g., about 300° C.–500° C.) to form the n-type defect layer. The irradiation energy used in the irradiation of protons may be not greater than about 1 MeV, since the range of the protons is long. An annealing temperature for activating the n-type defect layer may be set at a lower temperature (not greater than about 700° C.) than the fusing point of the anode electrode 8, which is typically made of aluminum. Therefore, the n-type defect layer as the $n^+$ cathode layer 1b can be formed, after the adhesion of the anode electrode 8, without any significant trouble. Of course, the diode can be manufactured in accordance with the invention at a low cost due to the use of the inexpensive n-type low impurity concentration FZ wafer. Since the $n^+$ cathode layer 1b is formed in a proton ion implantation method, the range can be long and the maximum concentration point can be set in a deep portion. As shown in FIG. 1, a graph representing the longitudinal dependency of a doping concentration, the impurity concentration inclines sharply in the n-type defect layer as the $n^+$ cathode layer 1b and at the boundary between the n defect layer and the $n^-$ drift layer 3b. Therefore, the longitudinal diode has high characteristics of the same level as the diode that is manufactured by using an epitaxial wafer.

Embodiment 2

In a longitudinal diode of a second embodiment, the $n^+$ cathode layer 1b is composed of an oxygen donor dope layer. If the $n^+$ cathode layer 1b is the oxygen donor dope layer, the annealing process can be performed at a lower temperature than a fusing point of the anode electrode 8 made of aluminum. Therefore, the $n^+$ cathode layer 1b can be formed, even after the adhesion of the anode electrode 8, with no significant problems.

The diode, in which the oxygen donor dope layer at the outermost portion of the reverse side is used as the $n^+$ cathode layer 1b, is fabricated by forming the element active region (the $p^+$ anode layer 4) and the anode electrode 8 at the right side of the FZ wafer, treating the reverse side of the FZ wafer to reduce it to a predetermined thickness, implanting oxygen ions from the reverse side of the FZ wafer and performing the annealing process (e.g., 300° C.–500° C.) to form the oxygen donor dope layer. The energy used in the implantation of the oxygen ions may not be greater than about 1 MeV, since the range of the protons is long. An annealing temperature for activating the n-type defect layer may be set at a lower temperature (not greater than about 700° C.) than the fusing point of the anode electrode 8 made, e.g., of aluminum. Therefore, the n-type defect layer as the $n^+$ cathode layer 1b can be formed without any significant trouble, even after the adhesion of the anode electrode 8. Of course, the diode can also be manufactured at low cost due to the use of the inexpensive n-type low impurity concentration FZ wafer. Since the $n^+$ cathode layer 1b is formed by an oxygen ion implantation method, the range can be long and the maximum concentration point can be set in a deep portion. As shown in FIG. 1, a graph representing the longitudinal dependency of a doping concentration, the impurity concentration inclines sharply in the n-type defect layer as the $n^+$ cathode layer 1b and at the boundary between the n defect layer and the $n^-$ drift layer 3b. Therefore, the longitudinal diode has high characteristics of the same level as a diode manufactured by using an epitaxial wafer.

Embodiment 3

A longitudinal diode of a third embodiment is characterized by the way in which annealing is performed in a manufacturing method therefor. More specifically, the manufacturing method of the present embodiment comprises the steps of forming the element active region (the $p^+$ anode layer 4) and the anode electrode 8 at the right side of the FZ wafer, treating the reverse side of the FZ wafer to reduce it to a predetermined thickness, implanting phosphorus or arsenic ions from the reverse side of the FZ wafer, and irradiating light or laser toward the reverse side of the FZ wafer while cooling the FZ wafer. The energy used in the implantation of the phosphorus or arsenic ions may be not greater than about 1 MeV. A dose amount of the phosphorus or arsenic is between about $1 \times 10^{12}$ cm$^{-2}$ and about $1 \times 10^{16}$ cm$^{-2}$. The right side of the FZ wafer is cooled, for example, by jetting coolant gas or by using a heat sink.

The annealing method can be a lamp annealing method or a laser annealing method, which is executed against the reverse side for a short period of time while the right side of the FZ wafer is cooled. During the annealing process, the annealing temperature at the reverse side can be set at a temperature higher than the fusing point of aluminum (not less than about 700° C.), while a temperature gradient is ensured across the thickness of the FZ wafer. Thus, even the implanted impurities with a short range can be activated sufficiently. For example, phosphorus or arsenic can be used as donor impurities. Of course, the diode can be manufactured at low cost due to the use of the inexpensive low impurity concentration FZ wafer. Since the n⁺ cathode layer 1b is formed in as oxygen ion implantation method, the range can be long and the maximum concentration point can be set in a deep portion. As shown in FIG. 1, a graph representing the longitudinal dependency of a doping concentration, the impurity concentration inclines sharply in the n-type defect layer as the n⁺ cathode layer 1b and at the boundary between the n defect layer and the n⁻ drift layer 3b. Therefore, the longitudinal diode has high characteristics of the same level as the diode that is manufactured by using an epitaxial wafer.

Figure 2:
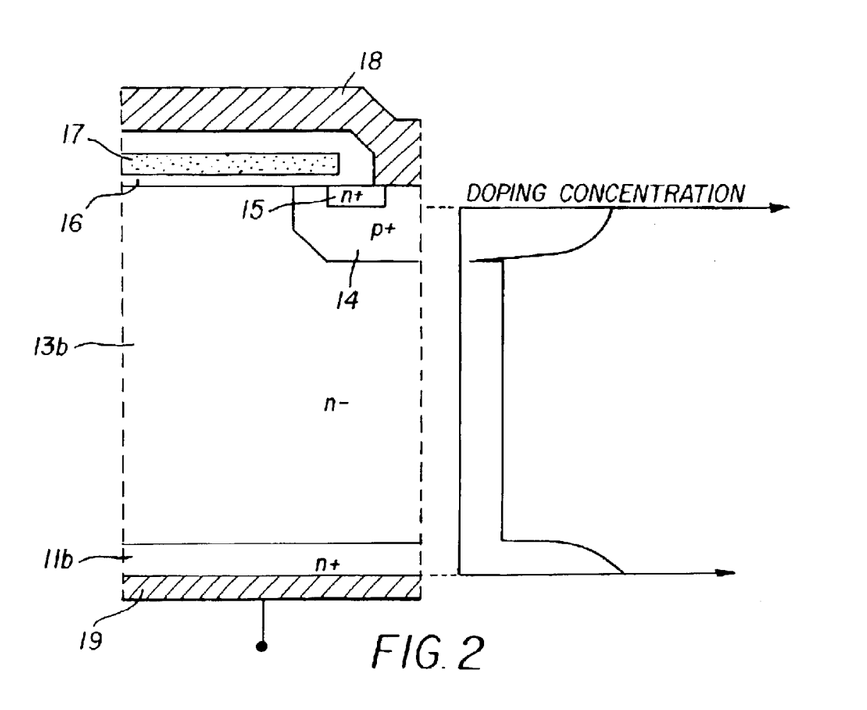
FIG. 2 is a cross-sectional view showing a part of the structure of a longitudinal MOSFET according to a second preferred embodiment of the present invention.

FIG. 2 is a cross-sectional view showing a part of the cross-sectional structure of a longitudinal MOSFET according to a preferred embodiment 2 of the present invention. The longitudinal MOSFET of this embodiment is a MOSFET with a withstand voltage of 600 V and is manufactured by using an n-type low impurity concentration FZ wafer to form an n⁻ drift layer 13b. An element active region (core part) and a source electrode 18 made of aluminum are formed on the right side of the FZ wafer. The element active region of the MOSFET is comprised of a well-shaped p⁺ base region 14 formed at the right side of the n⁻ drift layer 13b, an n⁺ source region 15 formed at the right side of the p⁺ base region 14, a gate electrode 17 made of polycrystal silicon formed through a gate oxide film, a source electrode 18 formed through an interlayer insulating film, and the like. An n⁺ drain layer 11b is formed at the outermost portion of the reverse side of the FZ water, and a drain electrode 19 made of aluminum is adhered to the n⁺ drain layer 11b.

The longitudinal MOSFET, which is manufactured by using the n-type low impurity concentration FZ wafer, is fabricated by forming the element active region and the source electrode 18 at the right side of the FZ wafer, treating the reverse side of the FZ wafer to reduce it to a predetermined thickness, implanting impurity ions described below from the reverse side of the FZ wafer, performing a predetermined annealing process to form the n⁺ drain layer 11b, and then adhering the drain electrode 19 to the n⁺ drain layer 11b.

Embodiment 4

In a longitudinal MOSFET of a fourth embodiment, the n⁺ drain layer 11b is composed of an n-type defect layer. The n-type defect layer is a monocrystal lattice defect layer and functions substantially as a high concentration n-type semiconductor layer. As described above, the diode, in which the n-type defect layer at the outermost portion of the reverse side is used as the n⁺ cathode layer 11b, is fabricated by forming the element active region and the source electrode 18 at the right side of the FZ wafer, treating the reverse side of the FZ wafer to reduce it to a predetermined thickness, irradiating protons from the reverse side of the FZ wafer and performing the annealing process (e.g., about 300° C.–500° C.) to form the n-type defect layer. The irradiation energy used in the irradiation of the protons may be not greater than about 1 MeV, since the range of the protons is long. An annealing temperature for activating the n-type defect layer may be set at a lower temperature electrode 18, which is typically made of aluminum. Therefore, the n-type defect layer as the n⁺ cathode layer 1b can be formed without any significant trouble, even after the adhesion of the source electrode 18. Of course, the diode can be manufactured at low cost due to the use of the inexpensive n-type low impurity concentration FZ water. Since the n⁺ cathode layer 1b is formed by a proton ion implantation method, the range can be long and the maximum concentration point can be set in a deep portion. As shown in FIG. 1, a graph representing the longitudinal dependency of a doping concentration, the impurity concentration inclines sharply in the n-type defect layer as the n⁺ cathode layer 1b and at the boundary between the n defect layer and the n⁻ drift layer 13b. Therefore, the longitudinal diode has high characteristics of the same level as the diode that is manufactured by using an epitaxial wafer.

Embodiment 5

In a longitudinal diode of a fifth embodiment, the n⁺ cathode layer 11b is composed of an oxygen donor dope layer. If the n⁺cathode layer 11b is the oxygen donor dope layer, the annealing process can be performed at a lower temperature than the fusing point of the source electrode 18, which is typically made of aluminum. Therefore, the n⁺ cathode layer 11b can be formed without any significant trouble, after the adhesion of the source electrode 8.

The diode, in which the oxygen donor dope layer at the outermost portion of the reverse side is used as the n⁺ cathode layer 11b, is fabricated by forming the element active region and the source electrode 18 on the right side of the FZ wafer, treating the reverse side of the FZ wafer to reduce it to a predetermined thickness, implanting oxygen ions from the reverse side of the FZ wafer and performing the annealing process (e.g., about 300° C.–500° C.) to form the oxygen donor dope layer. The implantation energy used in the implantation of the oxygen ions may be not greater than about 1 MeV since the range of the protons is long. An annealing temperature for activating the n-type defect layer may be set at a lower temperature (not greater than 700° C.) than the fusing point of the source electrode 8, which is typically made of aluminum. Therefore, the n-type defect layer as the n⁺ cathode layer 11b can be formed without any significant trouble, after the adhesion of the source electrode 18. Of course, the diode can be manufactured at low cost due to the use of the inexpensive n-type low impurity concentration FZ wafer. Since the n⁺ cathode layer 11b is formed by an oxygen ion implantation method, the range can be long and the maximum concentration point can be set in a deep portion. As shown in FIG. 2, a graph representing the longitudinal dependency of a doping concentration, the impurity concentration inclines sharply in the n-type defect layer as the n⁺ cathode layer 11b and at the boundary between the n defect layer and the n⁻ drift layer 13b. Therefore, the longitudinal diode has high characteristics of the same level as the diode that is manufactured by using an epitaxial wafer.

Embodiment 6

A longitudinal diode of a sixth embodiment is characterized by the way the annealing process is performed in a manufacturing method therefor. More specifically, the manufacturing method of the present embodiment comprises the steps of forming the element active region and the source electrode 18 at the right side of the FZ wafer, treating the reverse side of the FZ wafer to reduce it to a predetermined thickness, implanting phosphorus or arsenic ions from the reverse side of the FZ wafer and irradiating light or laser to the reverse side of the FZ wafer while cooling the FZ wafer. The implantation energy used in the implantation of the phosphorus or arsenic ions may be not greater than about 1 MeV. A dose amount of the phosphorus or arsenic is between about $1 \times 10^{13}$ cm$^{-2}$ and about $1 \times 10^{16}$ cm$^{-2}$. For example, the right side of the FZ wafer is cooled by jetting coolant gas or by using a heat sink.

The annealing method is typically a lamp annealing method or a laser annealing method, and it is usually executed for the reverse side for a short period of time while the right side of the FZ wafer is cooled. During the annealing step, the annealing temperature at the reverse side can be set at a higher temperature (about 700° C. or above) than the fusing point of aluminum, while a temperature gradient is ensured across the thickness of the FZ wafer. Thus, even the implanted impurities with a short range can be activated sufficiently. For, example, phosphorus or arsenic can be used as donor impurities. Of course, the diode can be manufactured at low cost due to the use of the inexpensive low impurity concentration FZ wafer. Since the n$^+$ cathode layer 11$b$ is formed in an oxygen ion implantation method, the range can be long and the maximum concentration point can be set in a deep portion. As shown in FIG. 2, a graph representing the longitudinal dependency of a doping concentration, the impurity concentration inclines sharply in the n-type defect layer as the n$^+$ cathode layer 1$b$ and at the boundary between the n defect layer and the n$^-$ drift layer 13$b$. Therefore, the longitudinal diode has high characteristics of the same level as the diode that is manufactured by using an epitaxial wafer.

Figure 3:
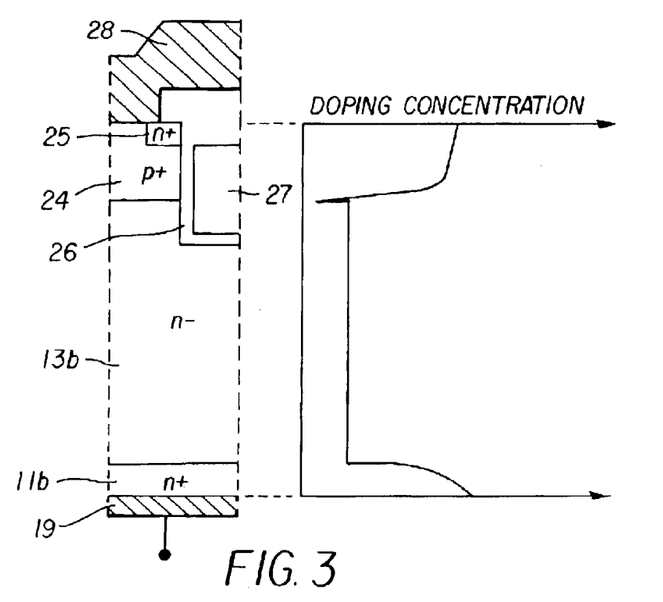
FIG. 3 is a cross-sectional view showing a part of the structure of a longitudinal MOSFET according to a third preferred embodiment of the present invention.

FIG. 3 is a cross-sectional view showing a part of the cross-sectional structure of a longitudinal MOSFET with a trench gate structure according to a preferred embodiment 3 of the present invention.

The longitudinal MOSFET with the trench gate structure according to this preferred embodiment is also manufactured by using an n-type low impurity concentration FZ wafer forming to n$^+$ drift layer 13$b$. The MOSFET with the trench gate structure is different from the longitudinal MOSFET of the preferred embodiment 2 in the element active region (core part). The element active region of the trench gate MOSFET has the trench gate structure, and comprises a p$^+$ base region 24 formed at the right side of the n$^-$ drift layer 13$b$, an n$^+$ source region 25 formed at the right side of the p$^+$ base region 24, a gate electrode 27 made of polycrystal silicon formed through a gate oxide film 26, a source electrode 28 formed through an interlayer insulating film, and the like. An n$^+$ drain layer 11$b$ is formed at the outermost portion of the reverse side of the FZ wafer, and a drain electrode 19 made of aluminum is adhered onto the n$^+$ drain layer 11$b$.

The longitudinal MOSFET with the trench gate structure is manufactured by the same method and has the same operational effects as in preferred embodiments 2 and 3. The trench gate structure of the element active region can further reduce the ON resistance.

Figure 4:
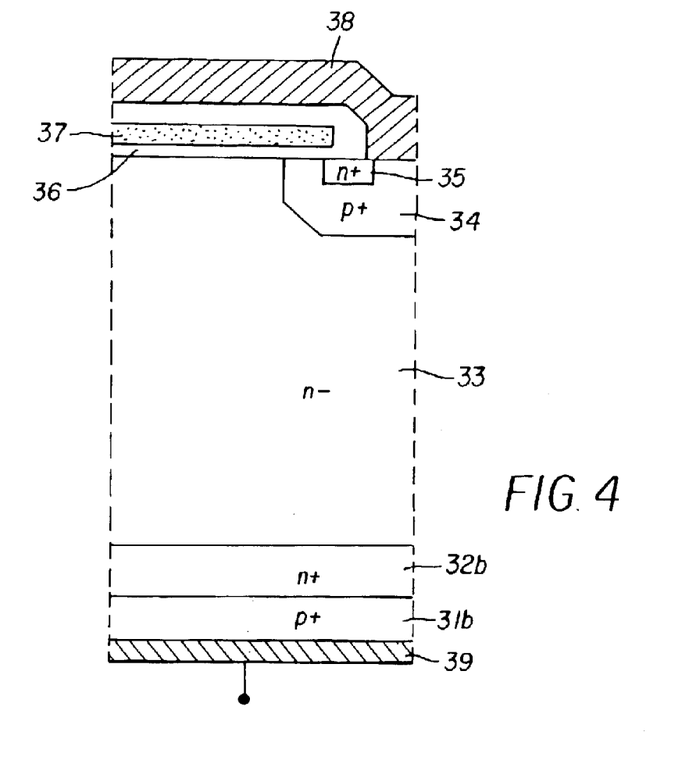
FIG. 4 is a cross-sectional view showing a part of the structure of a punch through IGBT according to a fourth preferred embodiment of the present invention.

There will now be described each preferred embodiment of the present invention with reference to the accompanying drawings. FIG. 4 is a cross-sectional view showing the cross-sectional structure of a punch through IGBT according to the fourth preferred embodiment.

The punch through IGBT of this preferred embodiment is an IGBT with a withstand voltage of 1200 V and is manufactured by using an n-type low impurity concentration FZ wafer forming an n$^-$ drift layer 33. An element active region and an emitter electrode 38 made of aluminum are formed at the right side of the FZ wafer. The element active region (core part) of the MOSFET is comprised of a well-shaped p$^+$ base region 34 formed at the right side of the n$^-$ drift layer 33, an n$^+$ emitter region 35 formed at the right side of the p$^+$ base region 34, a gate electrode 37 made of polycrystal silicon formed through a gate oxide film 36, an emitter electrode 38 formed through an interlayer insulating film, and the like. A p$^+$ collector layer 31$b$ is formed at the outermost portion of the reverse side of the FZ wafer, and a collector electrode 39 made of aluminum is adhered to the p$^+$ collector layer 31$b$. An n$^+$ buffer layer 32$b$ is formed between the n$^-$ drift layer 33 and the p$^+$ collector layer 31$b$.

The longitudinal MOSFET, which is manufactured by using the n-type low impurity concentration FZ wafer, is fabricated by forming the element active region and the emitter electrode 38 on the right side of the FZ wafer, reducing the reverse side of the FZ wafer to reduce it to a predetermined thickness, implanting impurity ions described below from the reverse side of the FZ wafer, performing a predetermined annealing process to form the n$^+$ buffer layer 32$b$ and the p$^+$ collector layer 31$b$, and then adhering the collector electrode 39 to them.

In a longitudinal MOSFET of a seventh embodiment, the n$^+$ buffer layer 32$b$ is composed of an n-type defect layer. The n-type defect layer is a monocrystal lattice defect layer, and functions substantially as a high concentration n-type semiconductor layer. As described above, the diode, in which the n-type defect layer at the outermost portion of the reverse side is used as the n$^+$ buffer layer 11$b$, is fabricated by forming the element active region and the emitter electrode 38 at the right side of the FZ wafer, treating the reverse side of the FZ wafer to reduce it to a predetermined thickness, irradiating protons from the reverse side of the FZ wafer, performing the annealing process (e.g., about 300° C.–500° C.) to form the n-type defect layer, implanting boron ions from the reverse side of the wafer and performing an annealing process of irradiating light or laser to the reverse side of the wafer for a short period of time while cooling the surface of the wafer, thereby forming the p$^+$ collector layer 31$b$.

The irradiation energy used in the irradiation of the protons may be not greater than about 1 MeV, since the range of the protons is long. The energy used in the implantation of the boron ions may be not greater than about 1 MeV, since the boron ions are implanted into the outermost layer of the reverse side. A dose amount of the boron may be not less than about $1 \times 10^{12}$ cm$^{-2}$ and not greater than about $1 \times 10^{15}$ cm$^{-2}$. For example, the right side of the wafer is cooled by jetting coolant gas or by using a heat sink.

An annealing temperature for activating the n-type defect layer may be set at a lower temperature (about 700° C. or less) than a fusing point of the emitter electrode 38 made of aluminum. Therefore, the n-type defect layer as the n+ buffer layer 32b can be formed without any significant trouble, even after the adhesion of the emitter electrode 38. Due to the use of an ion implantation method, the range can be long and the maximum concentration point can be set in a deep portion.

The annealing method is typically a lamp annealing method or a laser annealing method, which is executed toward the reverse side for a short period of time while the right side of the FZ wafer is cooled (the right side is cooled to not greater than about 450° C. to prevent the increase in a contact resistance between the emitter electrode 38 made of aluminum and the silicon at the right side of the wafer). During the annealing, the annealing temperature at the reverse side can be set at a higher temperature than the fusing point of aluminum (about 700° C. or more), while a temperature gradient is ensured across the thickness of the FZ wafer. Thus, even the implanted impurities with a short range can be activated sufficiently. For example, boron can be used as a donor impurity.

Of course, the diode can be manufactured at low cost due to the use of the inexpensive low impurity concentration FZ wafer.

Either the n+ buffer layer 32b or the p+ collector layer 31b may be formed first. The annealing process in the formation of the n+ buffer layer 32b may also be performed for the formation of the p+ collector layer 31b. This would reduce the number of annealing steps.

In a punch through IGBT of an eighth embodiment, the n+ buffer layer 32b is composed of as oxygen donor dope layer. If the n+ buffer layer 32b is the oxygen donor dope layer, the annealing process can be performed at a lower temperature than a fusing point of the emitter electrode 38, which is typically made of aluminum. Therefore, the n+ buffer layer 32b can be formed without any significant trouble, even after the adhesion of the emitter electrode 8.

The diode, in which the oxygen donor dope layer at the outermost portion of the reverse side is used as the n+ buffer layer 32b, is fabricated by forming the element active region and the emitter electrode 38 at the right side of the FZ wafer, treating the reverse side of the FZ wafer to reduce it to a predetermined thickness (such as by shaving), implanting oxygen ions from the reverse side of the FZ wafer and performing the annealing process (e.g., about 300° C.–500° C.) to form the oxygen donor dope layer, and performing an annealing process of irradiating light or laser to the reverse side of the wafer to form the p+ collector layer 31b while cooling the right side of the wafer. In this case, either the n+ buffer layer 32b or the p+ collector layer 31b may be formed first. The annealing process in the formation of the p+ collector layer 31b may also be used for the formation of the n+ buffer layer 32b. This would reduce the number of annealing steps.

The implantation energy used in the implantation of oxygen ions may be not greater than about 1 MeV, since the range of the protons is long. An annealing temperature for activating the n-type defect layer may be set at a lower temperature (about 700° C. or less) than the fusing point of the emitter electrode 8, which is typically made of aluminum. Therefore, the n-type defect layer as the n+ buffer layer 32b can be formed without any significant trouble, even after the adhesion of the emitter electrode 38. Of course, the diode can be manufactured at low cost due to the use of the inexpensive n-type low impurity concentration FZ wafer. The present embodiment achieves the same effects as the embodiment 1.

A method for manufacturing a punch through IGBT of a ninth embodiment comprises the steps of forming element active region and the emitter electrode 38 made of aluminum at the right side of the FZ wafer; treating the reverse side of the FZ wafer to reduce it to a predetermined thickness (such as by shaving); implanting phosphorus or arsenic ions from the reverse side of the FZ wafer; performing an annealing process of irradiating light or laser to the reverse side of the FZ wafer to form the n+ buffer layer 32b, while cooling the right side of the wafer; implanting boron ions from the reverse side of the FZ wafer; and performing an annealing process by irradiating with light or a laser the reverse side of the FZ wafer to form the p+ collector layer 31b while cooling the right side of the FZ wafer. The right side of the FZ wafer is cooled, for example, by jetting coolant gas or by using a heat sink. The implantation energy used in the implantation of the boron ions may be not greater than about 1 MeV, since the boron ions are implanted into the outermost layer of the reverse side. A dose amount of the boron may be not less than about $1 \times 10^{12}$ cm$^{-2}$ and not greater than about $1 \times 10^{15}$ cm$^{-2}$.

According to the present embodiment, the p+ collector layer 31b is formed in the same manner as in embodiments 7 and 8, but the n+ buffer layer 32b is formed by implanting phosphorus or arsenic ions from the reverse side and irradiating light or laser to the reverse side for a short period of time while cooling the right side. During the annealing, the annealing temperature at the reverse side can be set at a higher temperature than the fusing point of aluminum (about 700° C. or more) while a temperature gradient is ensured across the thickness of the FZ wafer. Thus, even the phosphorus or arsenic ions with a short range can be activated sufficiently. The embodiment 9 achieves the same effects as the embodiments 7 and 8.

Figure 5:
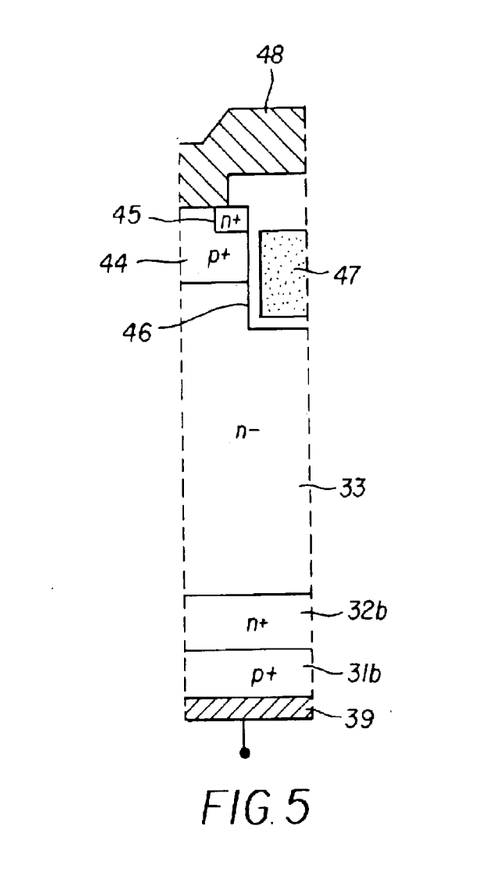
FIG. 5 is a cross-sectional view showing a part of the structure of a punch through IGBT with a trench gate structure according to a fifth preferred embodiment of the present invention.

FIG. 5 is a cross-sectional view showing a part of the cross-sectional structure of a punch through IGBT with a trench gate structure according to the preferred embodiment 5 of the present invention.

The punch through IGBT with the trench gate structure according to this preferred embodiment is also manufactured by using an n-type low impurity concentration FZ wafer forming an n$^{30}$ buffer layer 32b. The punch through IGBT according to this preferred embodiment is different from the punch through IGBT of the preferred embodiment 4 in the element active region (core part). The element active region of the punch through IGBT with the trench gate structure is comprised of a p+ base region 44 formed at the right side of the n− drift layer 33, an n+ emitter region 45 formed at the right side of the p+ base region 44, a gate electrode 47 made of polycrystal silicon implanted into a trench formed with a larger depth than the p+ base region 44 through a gate oxide film 46, an emitter electrode 48 formed through an interlayer insulating film, and the like. A p+ collector layer 31b is formed at the outermost portion of the reverse side of the FZ wafer, and a collector electrode 39 made of aluminum is adhered to the p+ collector layer 31b. The n+ buffer layer 32b is formed between the n− drift layer 33 and the p+ collector layer 31b.

The punch through MOSFET with the trench gate structure as described above is manufactured in the same method and has the same operational effects as in preferred embodiment 4. The trench gate structure of the element active region further reduces the ON resistance.

As set forth hereinabove, the present invention is characterized by forming the high impurity concentration layer at the outermost portion of the second principal side, which functions as the ohmic contact layer such as the cathode layer of the longitudinal diode, the drain layer of the longitudinal MOSFET and the collector layer of the non-punch through IGBT in the low temperature process. Thus, the present invention achieves the effects described hereinbelow.

1) The method for manufacturing the semiconductor device, in which the n-type defect layer at the outermost portion of the second principal side is used as the high concentration n-type semiconductor layer, such as a contact layer, comprises the steps of: forming the element active region and the first electrode at the first principal side of the substrate; treating the second principal side of the substrate to reduce it to a predetermined thickness; irradiating protons toward the second principal side; and performing the annealing process to thereby form the n-type defect layer. Therefore, the annealing temperature for activating the n-type defect layer (less than about 700° C.) may be lower than the fusing point of the first electrode layer made of aluminum or the like. Therefore, it is possible with the invention to form the n-type defect layer at the second principal side without any significant trouble, even after the adhesion of the first electrode at the first principal side. This semiconductor device can also be manufactured at low cost, since it is possible to use an inexpensive n-type low impurity concentration FZ wafer. Moreover, the impurity concentration inclines sharply in the n-type defect layer in the high impurity concentration layer and at the boundary between the n defect layer and the low impurity concentration drift layer. This achieves high characteristics of the same level as a semiconductor device that is manufactured by using an epitaxial wafer.

2) The method for manufacturing the semiconductor device, in which the oxygen donor dope layer is used as the high concentration n-type semiconductor layer such as a contact layer, comprises the steps of: forming the element active region and the first electrode at the first principal side of the substrate; implanting oxygen ions from the second principal side; and performing the annealing process to thereby form the n-type defect layer. This semiconductor device can be manufactured at low cost, since it is possible to use an inexpensive n-type low impurity concentration FZ wafer. Moreover, the impurity concentration inclines sharply in the n-type defect layer of the high impurity concentration layer and at the boundary between the n defect layer and the low impurity concentration drift layer. This achieves high characteristics of the same level as a semiconductor device that is manufactured by using an epitaxial wafer.

3) If the semiconductor device is manufactured in the method comprising the steps of forming the element active region and the first electrode at the first principal side of the substrate; implanting impurity ions from the second principal side; and performing the annealing process of irradiating light or laser to the second principal side, while cooling the first principal side to thereby form the high impurity concentration layer, the annealing temperature at the second principal side can be set at a higher temperature than the fusing point of aluminum, while a temperature gradient is ensured across the thickness of the substrate. This enables the sufficient activation of the implanted impurities with a short range, and makes it possible to use phosphorus, arsenic or the like as donor impurities and to use boron or the like as the acceptor impurities. The semiconductor device can be manufactured at low cost, since it is possible to use an inexpensive low impurity concentration FZ wafer. Moreover, the impurity concentration inclines sharply in the high impurity concentration layer and at the boundary between the high impurity concentration layer and the drift layer. This achieves high characteristics of the same level as a semiconductor device that is manufactured by using an epitaxial wafer.

As set forth hereinabove, the present invention is characterized by forming the high impurity concentration buffer layer at the second principal side and the reverse-conductivity-type high impurity concentration layer at the outermost portion of the second principal side in the low-temperature process. Thus, the present invention achieves the effects described hereinbelow.

4) The method for manufacturing the semiconductor device comprises the steps of forming the element active region and the first electrode at the first principal side; treating the second principal side of the substrate to reduce it to a predetermined thickness; such as by shaving; irradiating protons toward the second principal side and performing an annealing process to thereby form the buffer layer; and implanting acceptor impurity ions from the second principal side and performing the annealing process to thereby form the second-conductivity-type high impurity concentration layer. Thus, the irradiation of protons and the low-temperature annealing process form the n-type defect layer, which functions as the buffer layer. The irradiation of the energy to the second principal side with or without the cooling of the first principal side can be performed in the annealing process for forming the second-conductivity-type high impurity concentration layer. This ensures the temperature gradient across the thickness of the substrate and, thus, the annealing temperature at the second principal side can be set at a higher temperature than the fusing point of aluminum or the like. This enables the sufficient activation of the implanted impurities with a short range. The semiconductor device can be manufactured at low cost, since it is possible to use the inexpensive low impurity concentration FZ wafer. The semiconductor device provided with the n-type high impurity concentration buffer layer increases the current capacity and reduces the turnoff loss. It is therefore possible to provide a semiconductor device with high performance.

5) The method for manufacturing the semiconductor device comprises the steps of forming the element active region and the first electrode at the first principal side of the substrate; treating the second principal side of the substrate to reduce it to a predetermined thickness, such as by shaving; irradiating protons toward the second principal side and performing as annealing process to thereby form the buffer layer; and implanting acceptor impurity ions from the second principal side and performing an annealing process to thereby form the second-conductivity-type high impurity concentration layer. Thus, the implantation of oxygen ions and the low-temperature annealing process forth the oxygen donor dope layer as the buffer layer. The annealing process for forming the second-conductivity-type high impurity concentration layer can be performed while a temperature gradient is ensured across the thickness of the substrate. Therefore, the annealing temperature at the second principal side can be set at a higher temperature than the fusing point of aluminum or the like metals. This enables the sufficient implantation of implanted impurities with a short range. The semiconductor device can be manufactured at low cost, since it is possible to use an inexpensive low impurity concentration FZ wafer. The semiconductor device provided with the n-type high impurity concentration buffer layer increases the current capacity and reduces the turnoff loss. It is therefore possible to provide a semiconductor device with high performance.

6) The method for manufacturing the semiconductor device comprises the steps of forming the element active region and the first electrode at the first principal side of the substrate and shaving the second principal side of the substrate to a predetermined thickness; implanting donor impurity ions from the second principal side and performing an annealing process of irradiating energy to the second principal side, while cooling the first principal side, to thereby form the buffer layer; and implanting acceptor impurity ions from the second principal side and performing an annealing process to thereby form the second-conductivity-type high impurity concentration layer. In either annealing process, the annealing temperature at the second principal side can be set at a higher temperature than the fusing point of aluminum or the like metals, and this enables the sufficient implantation of the implanted impurities with a short range. The semiconductor device can be manufactured at low cost, since it is possible to use an inexpensive low impurity concentration FZ wafer. The semiconductor device provided with the n-type high impurity concentration buffer layer increases the current capacity and reduces the turnoff loss. It is therefore possible to provide the semiconductor device with high performance capability.

7) The method for manufacturing the semiconductor device comprises the steps of: forming the element active region and the first electrode at the first principal side of the substrate; treating the second principal side of the substrate to reduce it to a predetermined thickness; and implanting first or second-conductivity-type impurity ions from the second principal side and performing an annealing process of irradiating energy to the second principal side, while cooling the first principal side to thereby form the high impurity concentration layer. Therefore, the annealing temperature at the second principal side can be set at a higher temperature than the fusing point of aluminum or the like metals, while the temperature gradient is ensured across the thickness of the substrate. This prevents the fusion of the first electrode (typically made of aluminum or the like metals) and enables the sufficient implantation of the implanted impurities with a short range. The semiconductor device can be manufactured at low cost since, with the invention, it is possible to use an inexpensive low impurity concentration FZ wafer.

What is claimed is:

1. A method for manufacturing semiconductor device that uses a first-conductivity-type low impurity construction floating zone (FZ) substrate forming a first-conductivity-type low impurity concentration drift layer, and which comprises an element active region and a first electrode thereof formed at a first principal side of said substrate, and a high impurity concentration layer and a second electrode thereof formed at an outermost portion of a second principal side of said substrate, said method comprising the steps of:

forming said element active region and said first electrode at said first principal side of said substrate and treating said second principal side of said substrate to reduce it to a predetermined thickness; and irradiating protons or implanting oxygen ions from said second principal side and performing an annealing process to thereby form said high impurity concentration layer.

2. A method for manufacturing a semiconductor device according to claim 1, wherein said annealing process is performed at a temperature of not less than about 300° C. and not greater than about 500° C.

3. A method for manufacturing a semiconductor device according to claim 1, wherein the irradiation energy used in the irradiation of protons is not greater than about 1 MeV.

4. A method for manufacturing a semiconductor device according to claim 2, wherein the irradiation energy in the irradiation of protons is not greater than about 1 MeV.

5. A method for manufacturing a semiconductor device which uses a first-conductivity-type low impurity concentration floating zone (FZ) substrate forming a first-conductivity-type low impurity concentration drift layer, which comprises an element active region and a first electrode thereof formed at a first principal side of said substrate, and a high impurity concentration layer with a second electrode thereof formed at an outermost portion of a second principal side of said substrate, said method comprising the steps of:

forming said element active region and said first electrode at said first principal side of said substrate and treating said second principal side of said substrate to reduce it to a predetermined thickness; and implanting impurity ions from said second principal side and irradiating light or laser to said second principal side while cooling said fist principal side to thereby form said high impurity concentration laser.

6. A method for manufacturing a semiconductor device according to claim 5, wherein said impurity ions are phosphorus or arsenic ions.

7. A method for manufacturing a semiconductor device according to claim 6, wherein the implantation energy used in the implantation of phosphorus or arsenic ions is about than 1 MeV or less.

8. A method for manufacturing a semiconductor device according to claim 6, wherein the dose amount of said phosphorus or arsenic ranges from about $1 \times 10^{13}$ cm$^{-2}$ and to about $1 \times 10^{16}$ cm$^{-2}$.

9. A method for manufacturing a semiconductor device according to claim 7, wherein a dose amount of said phosphorus or arsenic is between about $1 \times 10^{13}$ cm$^{-2}$ and $1 \times 10^{16}$ cm$^{-2}$.

* * * * *